United States Patent [19]

Frensley et al.

[11] Patent Number: 5,059,545

[45] Date of Patent: Oct. 22, 1991

[54] THREE TERMINAL TUNNELING DEVICE AND METHOD

[75] Inventors: William R. Frensley, Richardson; Mark A. Reed, Dallas, both of Tex.

[73] Assignee: Texas Instruments Incorporated, Dallas, Tex.

[21] Appl. No.: 559,521

[22] Filed: Jul. 24, 1990

Related U.S. Application Data

[60] Division of Ser. No. 231,622, Aug. 8, 1988, abandoned, which is a continuation of Ser. No. 825,720, Jan. 31, 1986, abandoned, which is a continuation-in-part of Ser. No. 768,542, Aug. 23, 1985, abandoned.

[51] Int. Cl.$^5$ .......................................... H01L 21/205
[52] U.S. Cl. ..................................... 437/31; 437/129
[58] Field of Search ................................ 437/31, 129

[56] References Cited

U.S. PATENT DOCUMENTS

| | | | |
|---|---|---|---|
| 4,163,237 | 7/1989 | Dingle et al. | 357/4 X |
| 4,286,275 | 8/1981 | Heiblum | 357/16 X |
| 4,396,931 | 8/1983 | Dumke et al. | 357/16 X |
| 4,529,996 | 7/1985 | Pande | 357/160 |
| 4,558,336 | 12/1985 | Chang et al. | 357/4 SLO |
| 4,575,924 | 3/1986 | Reed et al. | 29/576 E |
| 4,665,412 | 3/1987 | Ohkawa et al. | 357/16 X |
| 4,758,870 | 7/1988 | Hase et al. | 357/34 |

FOREIGN PATENT DOCUMENTS

| | | | |
|---|---|---|---|
| 0067276 | 12/1982 | European Pat. Off. | |
| 0068064 | 1/1983 | European Pat. Off. | 357/4 SL |
| 0084393 | 7/1983 | European Pat. Off. | |
| 0159273 | 10/1985 | European Pat. Off. | 357/4 SL |
| 2607940 | 9/1977 | Fed. Rep. of Germany | 357/4 SL |
| 52-105785 | 9/1977 | Japan | 357/4 SL |
| 58-142574 | 8/1983 | Japan | 357/4 SL |
| 60-10775 | 1/1985 | Japan | 357/16 |

OTHER PUBLICATIONS

Ricco and Solomon, "Tunable Resonant Tunnelling Semiconductor Emitter Structure", 27 IBM Tech Discl. Bull. 3053, Oct., 1984.

Chang, L. L., et al. "Tunnel Triode—A Tunneling Base Transistor" Appl. Phys. Lett. 15 Nov. 1977 pp. 687–689.

Zipperian, T. E., et al, "InGaAs/GaAs, Strained–Layer Superlattice . . . " IEDM 84, Dec. 1984, pp. 524–527.

Yokoyama, N., et al. "A New Functional, Resonant—Tunneling Hot Electron Transistor" JJAP, 11 Nov. 1985, pp. 853–854.

*Primary Examiner*—Olik Chaudhuri
*Assistant Examiner*—Ourmazd Ojan
*Attorney, Agent, or Firm*—Melvin Sharp; James T. Comfort; N. Rhys Merrett

[57] ABSTRACT

A tunneling device (50) with the emitter (62) to collector (58) current transported by resonant tunneling through a quantum well (52) and controlled by carriers injected into the well (52) from a base (60) is disclosed. The injected carriers occupy a first energy level in the well (52) and the resonant tunneling is thorough a second energy level in the well (52) thereby separating the controlled carriers from the controlling carriers. Another Three-terminal tunneling devices using three different bandgap semiconductor materials to segregate controlling carriers from controlled carriers are disclosed. Preferred embodiments include narrow bandgap quantum wells and medium bandgap emitters so that narrow bandgap bases may inject and withdraw controlling electrons to the well by tunneling with the controlled electron current tunneling through a higher energy level in the well or so that medium bandgap bases may control holes in the well with only a small forward bias on the emitter-base junction and thereby control electrons tunneling through the well from emitter to collector.

7 Claims, 14 Drawing Sheets

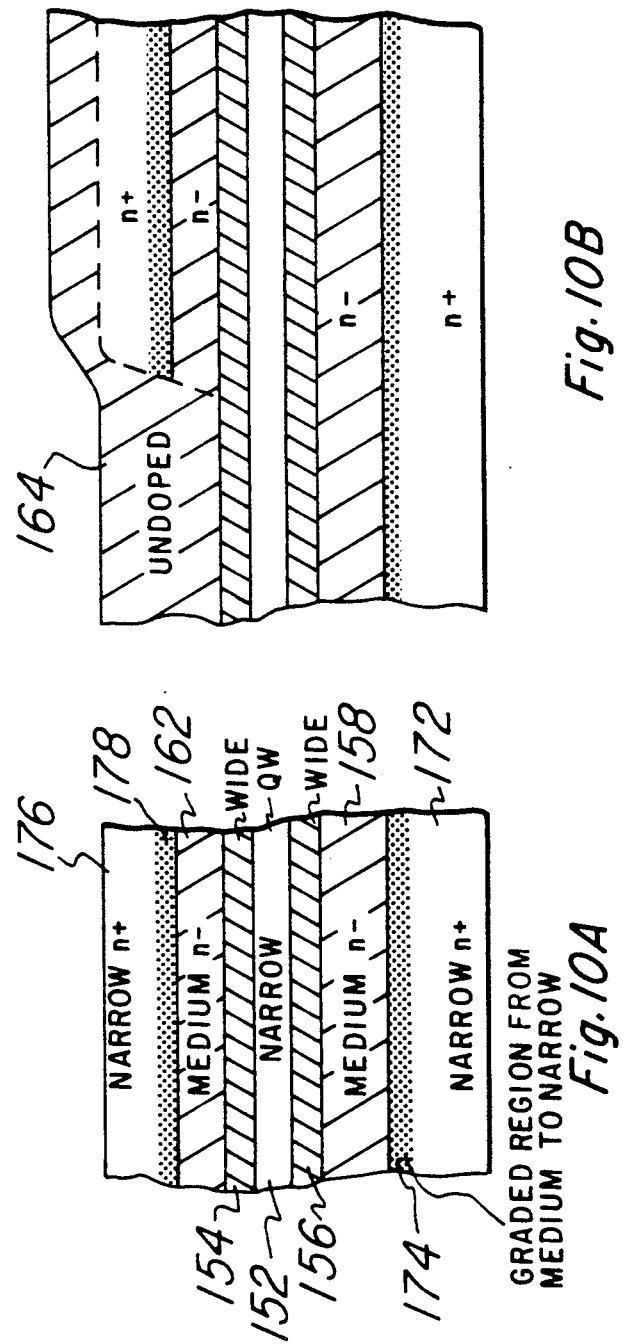

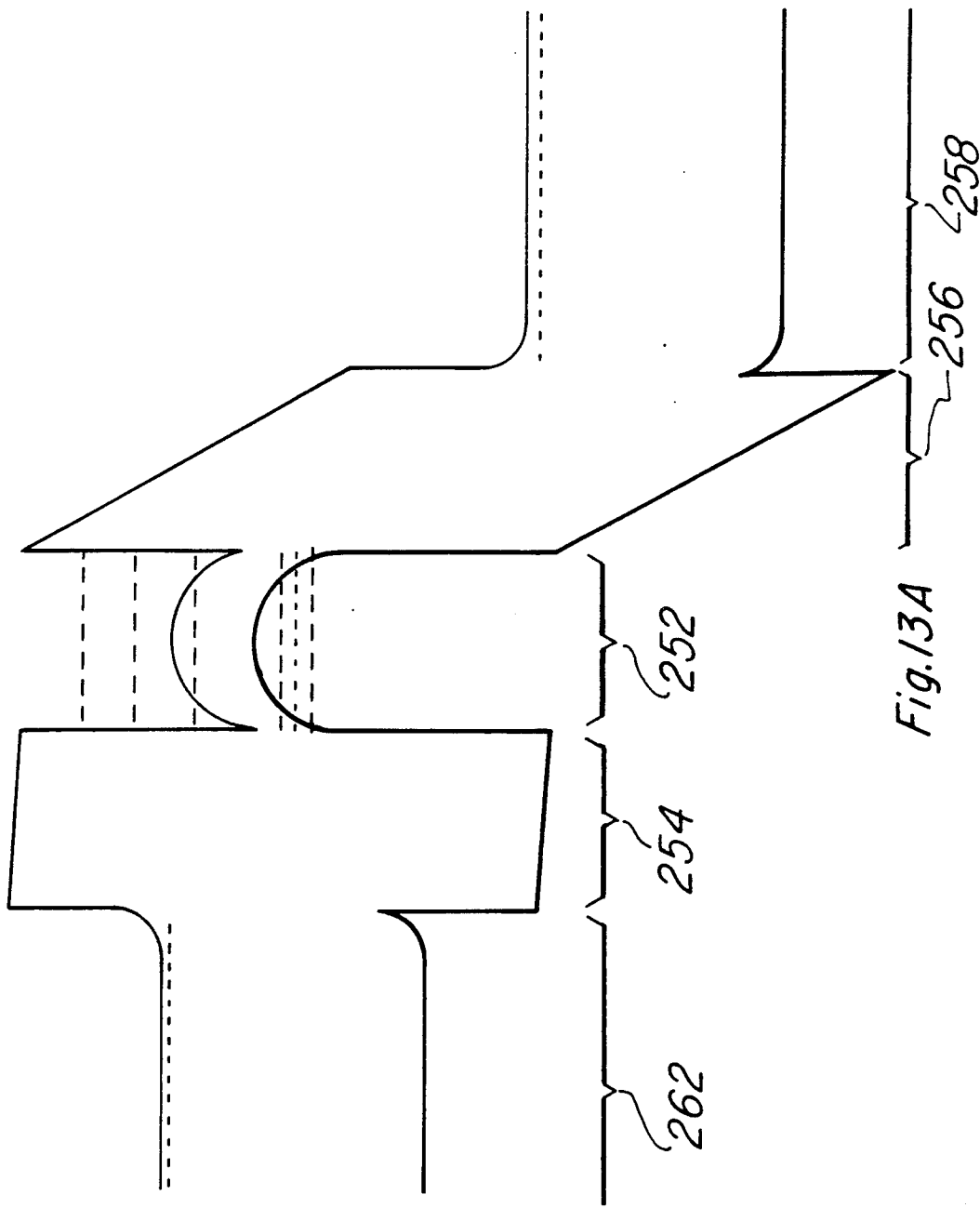

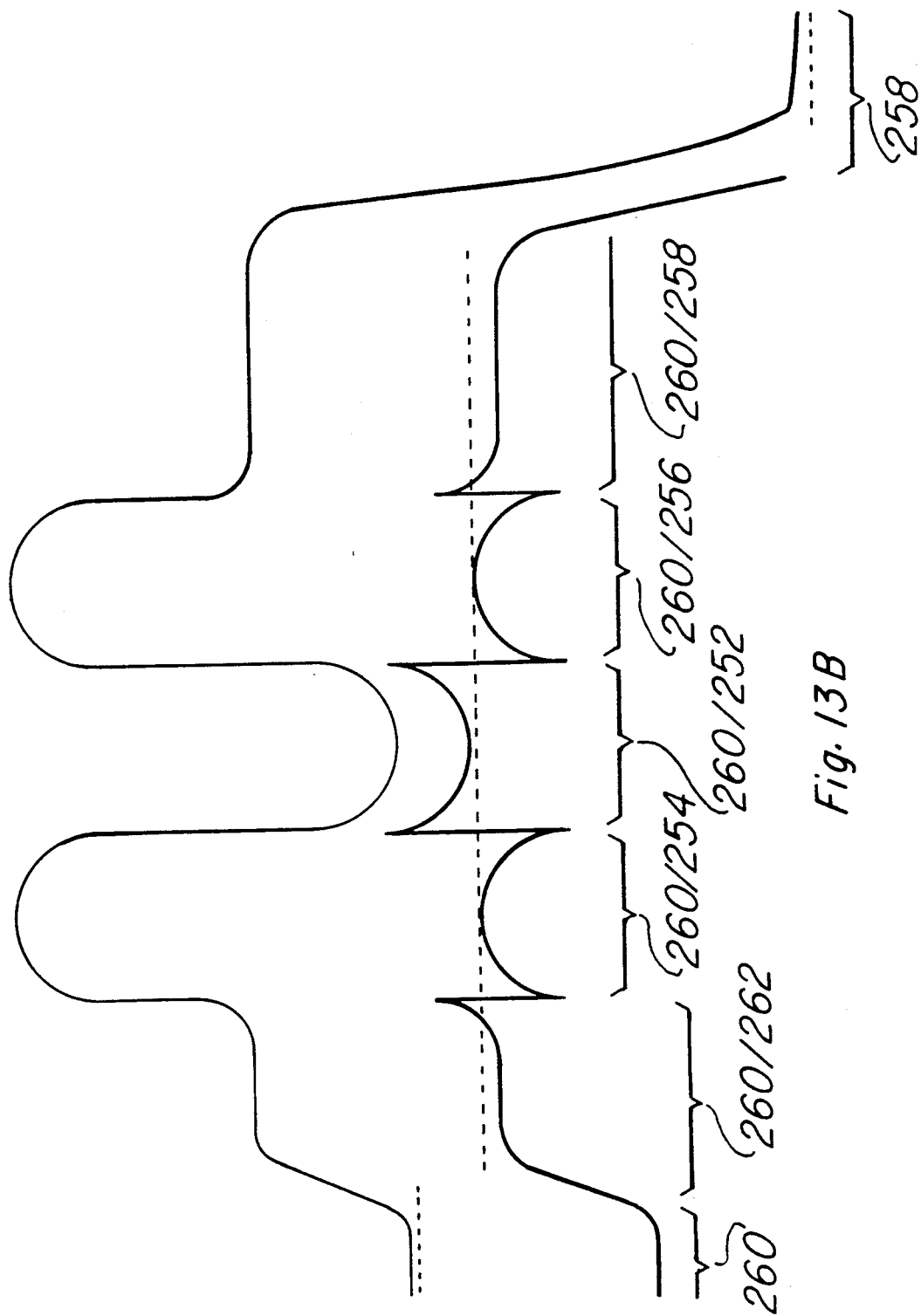

_5,059,545_

THREE TERMINAL TUNNELING DEVICE AND METHOD

Statement as to rights to inventions made under federally spousored research and developement.

CROSS-REFERENCE TO RELATED APPLICATIONS

This application is a division of Ser. No. 07/231,622 now abandoned, filed Aug. 8, 1988 which is a continuation of Ser. No. 06/825,720 now abandoned filed Jan. 31, 1986 which is a continuation-in-part of copending application Ser. No. 768,542, filed Aug. 23, 1985 now abandoned; the applications are assigned to a common assignee.

BACKGROUND OF THE INVENTION

1. Field of the Invention

The present invention relates to electronic semiconductor devices, and, more particularly, to quantum well devices in which carrier resonant tunneling through the well is modulated.

2. Description of the Related Art

Quantum well devices are known in various forms, heterostructure lasers being a good example. Quantum well heterostructure lasers rely on the discrete energy levels in the quantum wells to achieve high efficiency and typically consist of a few coupled quantum wells; see, generally, Sze, Physics of Semiconductor Devices, 729–730 (Wiley Interscience, 2d Ed 1981). High Electron Mobility Transistors (HEMTs) are another type of quantum well device and typically use only one half of a quantum well (a single heterojunction) but may include a stack of a few quantum wells. The HEMT properties arise from conduction parallel to the heterojunctions and in the quantum well conduction or valence subbands; the conduction carriers (electrons or holes) are isolated from their donors or acceptors and this isolation limits impurity scattering of the carriers. See, for example, T. Drummond et al, Electron Mobility in Single and Multiple Period Modulation-Doped (Al,Ga)As/GaAs Heterostructures, 53 J. Appl. Phys. 1023 (1982). Superlattices consist of many quantum wells so tightly coupled that the individual wells are not distinguishable, but rather the wells become analogous to atoms in a lattice. Consequently, superlattices behave more like new types of materials than as groups of coupled quantum wells; see, generally, L. Esaki et al, Superfine Structure of Semiconductors Grown by Molecular-Beam Epitaxy, CRC Critical Reviws in Solid State Sciences 195 (April 1976).

Resonant tunneling devices are the simplest quantum well devices that exhibit quantum confinement and coupling and were first investigated by L. Chang et al, 24 Appl. Phys. Lett. 593 (1974), who observed weak structure in the current-voltage characteristics of resonant tunneling diodes at low temperatures. More recently, Sollner et al, 43 Appl. Phys. Lett. 588 (1983), have observed large negative differential resistance in such devices (peak-to-valley ratios as large as six to one have been obtained), and Shewchuk et al, 46 Appl.-Phys.Lett. 508 (1985) and M. Reed, to appear, have demonstrated room temperature resonant tunneling.

A typical resonant tunneling diode structure is schematically illustrated in FIGS. 1A–D; FIG. 1A is a schematic cross sectional view, FIG. 1B illustrates the profile of the conduction band edge through such a diode with no bias, FIG. 1C is the conduction band edge for bias into resonance, and FIG. 1D is a typical current-voltage characteristic for the diode at low temperature. The preferred material is the lattice matched system of $GaAs/Al_xGa_{1-x}As$, although resonant tunneling has been observed in strained-layer heterostructure systems; see Gavrilovic et al, to appear. The two $Al_xGa_{1-x}As$ layers that define the central GaAs quantum well (see FIGS. 1B–C) serve as partially transparent barriers to electron transport through the diode. Resonant tunneling occurs when the bias across the outer terminals is such that one of the quantum well bound states has the same energy level as the input electrode Fermi level. Peaks in the electron transmission (current) as a function of bias (voltage) are thus observed. The resonant tunneling diode is the electrical analog of a Fabry-Perot resonantor. Leakage (inelastic tunneling current) is determined by the quality of the $GaAs/Al_xGa_{1-x}As$ interfaces and electron-phonon scattering.

The resonant tunneling diode has high speed charge transport (less than 100 femtoseconds) which implies applications to microwave oscillators and high speed switches. But the utility of such diodes is limited since they presently only exist as two terminal devices. The technology to contact the central quantum well (a third terminal) has not been demonstrated and, consequently, only two terminal diodes have been investigated. However, conventional semiconductor integrated circuit technology indicates that three-terminal devices will be necessary to build usable quantum well device systems. And fundamental problems arise with the obvious approaches to such three-terminal devices as described in the following.

A three-terminal resonant tunneling device requires a way to control the current through the device with a voltage or current supplied to the control terminal; the current through the device is presumed to be conducted by resonant tunneling of electrons. Now the obvious approach is to try to manipulate the potential of the quantum well. If this is to be done through the electrostatic potential, then mobile charges must be added to or removed from the device by the control terminal and these mobile charges will act as sources of the perturbation in the potential. However, the available mobile charges in semiconductors are electrons and holes, and both have problems. First consider what happens when holes are used to control the tunneling current. Because we want to modify the potential in the quantum well, the holes should be placed in the well formed by the valence-band discontinuity; see FIGS. 2A–B illustrating a three-terminal device (with the conduction current terminals labelled "emitter" and "collector" and the control terminal labelled "base" in analogy with bipolar transistors) and the conduction and valence band edges through such a device. To achieve resonant tunneling, the potential of the bottom of the quantum well must be biased below the conduction band edge in the emitter (source) terminal. Note that this implies that the emitter to base bias must be greater than the narrower band gap and in the forward direction for current flow. Now contact with the holes in the quantum well implies a bulk region that is doped p type. If this p region is in contact with the n type emitter, catastrophic current will result. Making the p type contact out of a higher bandgap semiconductor material (by selective epitaxy) does not solve the problem because the forward voltage of the parasitic p-n heterojunction is determined by the smaller bandgap.

The use of electrons to control the quantum well potential poses a different set of problems, which are closely related to those of the more conventional hot-electron transistors. See J. Shannon and A. Gill, High Current Gain in Monolithic Hot Electron Transistors,. 17 Electronics Letters 620 (1981); J. Shannon, Calculated Performance of Monolithic Hot-Electron Transistors, 128 IEEE Proceedings 134 (1981); M. Hollis et al, Importance of Electron Scattering with Coupled Plasmon-Optical Phonon Modes in GaAs Planar-Doped Barrier Transistors, 4 IEEE Electron Device Letters 440 (1983); and, generally, Sze, Physics of Semiconductor Devices 184 (Wiley-Interscience 2d Ed, 1981). To make such a device work we must essentially distinguish between the electrons controlling the current and those carrying the current, but electrons are indistinguishable particles, and thus the device must keep the two groups of electrons separated. As a particular case of this problem, consider the device shown in FIG. 3A, which includes a quantum well that is separately contacted to provide the control terminal, and its conduction band edge along lines A—A and B—B and shown in FIGS. B–C. Any electrons supplied to the quantum well from the base contact can readily tunnel out of the well. If we tried to raise or widen the barrier on the collector side to confine these control electrons, we would cut off the desired current of tunneling electrons. Note that the possible solution to this parasitic base-collector current would initially be to buffer the base region from the collector with a high bandgap region as shown in FIG. 3D. Here the same criticsim as before applies to current flow along the line C—C, though considerably less in this case due to the relative cross section of emitter-collector to base-collector. The balancing of constraints in such a device makes the possibility of successfully modulating the quantum well potential doubtful.

Also of interest is Esaki, Eu. Pat. Appl. No. 82100162.5, published Jan. 5, 1983, which tunnels electrons from an ohmic contact through an $Al_{0.7}Ga_{0.3}As$ n++ doped emitter, an excited level in a GaAs n+ doped quantum well base, an $Al_{0.7}Ga_{0.3}As$ n++ doped collector to an output ohmic contact. An ohmic contact is made to the base, but the problem of segregating the controlling and controlled carriers is not considered. Also, the base carriers can merely tunnel out into the collector and vitiate any base control.

Clearly, we need a better method of separation of controlling electrons from controlled electrons than that of the device of FIG. 3. Conventional semiconductor technology suggests confinement of the controlling electrons within a metal, preferably behind a high energy barrier (insulator). A possible such device, analogous to a field effect transistor, is illustrated in FIG. 4A with the conduction band edges along lines B—B and C—C shown in FIGS. 4B–C. The quantum well layer is accessed by tunneling source and drain contacts on the top side of the layer, and the gate establishes the bias on the quantum well, thus controlling tunneling into the quantum well. The device is biased so that electrons tunnel from the source into the well, drift to the regions under the drain, and tunnel out. The operation of the device raises questions of transverse transport in quantum wells; additionally, the large area gate will create excessive capacitance, which will limit the speed of operation.

In short, there is a problem to maintain the distinction between controlled and controlling carriers for three-terminal quantum well resonant tunneling devices.

SUMMARY OF THE INVENTION

The present invention provides quantum well resonant tunneling devices made of at least three different bandgap semiconductor materials to maintain the distinction between controlled and controlling carriers. Preferred embodiments include (1) the use of control electrons in a low level in a conduction band well with the tunneling current also electrons resonantly tunneling through an excited level in the conduction band well and (2) the use of control holes in a valence band well with the tunneling current electrons resonantly tunneling through a level in the corresponding conduction band well. The distinction between controlled and controlling carriers is achieved by the bandgap of the emitter material or collector material or both being greater than that of the quantum well material; this provides containment of electrons in a lower level in the well for preferred embodiments (1) and provides forward emitter-base bias far below the bandgap while still moving the well levels into resonance with the emitter band edge for preferred embodiments (2). Thus the problems of distinction between controlled and controlling carriers is solved.

BRIEF DESCRIPTION OF THE DRAWINGS

FIGS. 10A–D are schematic cross sectional views of a second preferred embodiment and steps of fabrication by a preferred embodiment method;

FIGS. 13A–B are conduction and valence band diagrams for the fourth preferred embodiment with an applied bias.

DESCRIPTION OF THE PREFERRED EMBODIMENTS

Figure 5A:
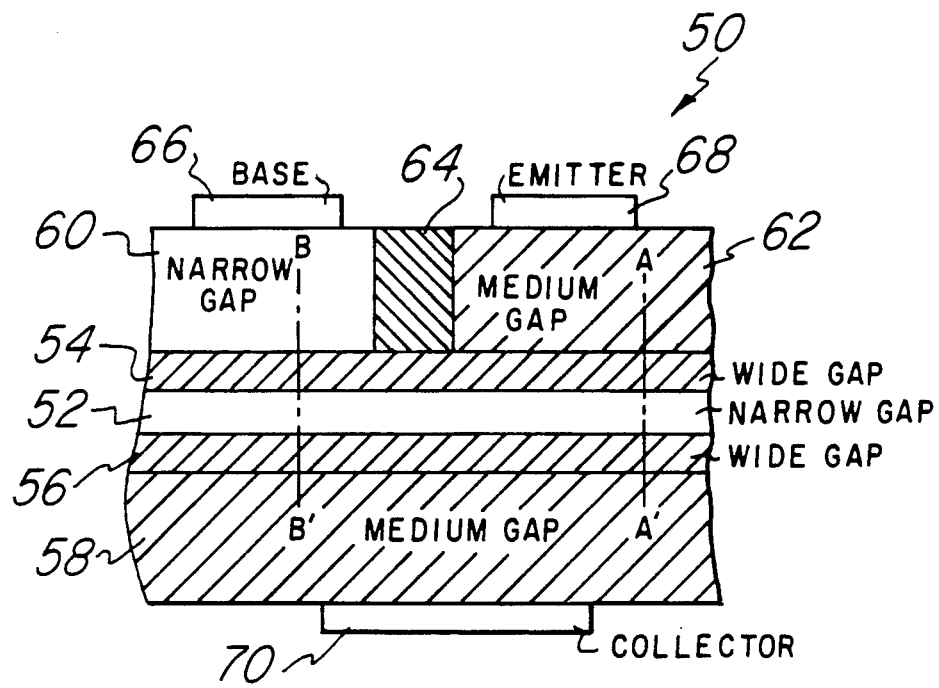
FIGS. 5A–B are schematic cross sectional and plan views of a first preferred embodiment excited state three-terminal resonant tunneling device.
Figure 5B:
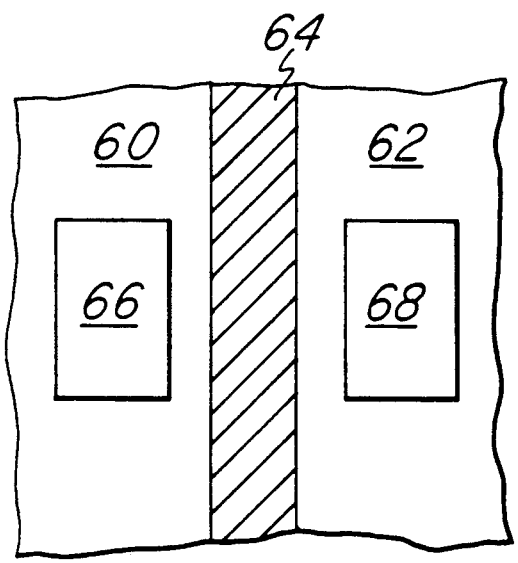

A first preferred embodiment three-terminal tunneling device, generally denoted 50, is illustrated in schematic cross sectional and plan views in FIGS. 5A–B, and includes layer 52 of undoped GaAs, layers 54 and 56 of undoped $Al_xGa_{1-x}As$ with $x=1.0$, layer 58 of Al$_x$Ga$_{1-x}$As with x=0.43 doped n type, region 60 of GaAs doped n+, region 62 of Al$_x$Ga$_{1-x}$As with x=0.43 doped n+, region 64 of undoped Al$_x$Ga$_{1-x}$As with x=1.0, and gold/germanium contacts 66, 68, and 70. These layers and regions are most conveniently referred to by the names of analogous structures; thus region 60 is called the base, region 62 the emitter, layer 58 the collector, layer 52 the well, and layers 54 and 56 the tunneling barriers. Layers 52, 54, 56, and 58 all have a common square cross section of about 10 microns by 10 microns but with thicknesses as follows: layer 52 is about 50 Å, layers 54 and 56 are both about 50 Å, and layer 58 plus regions 60, 62, and 64 are all about 1 micron.

Figure 6A:
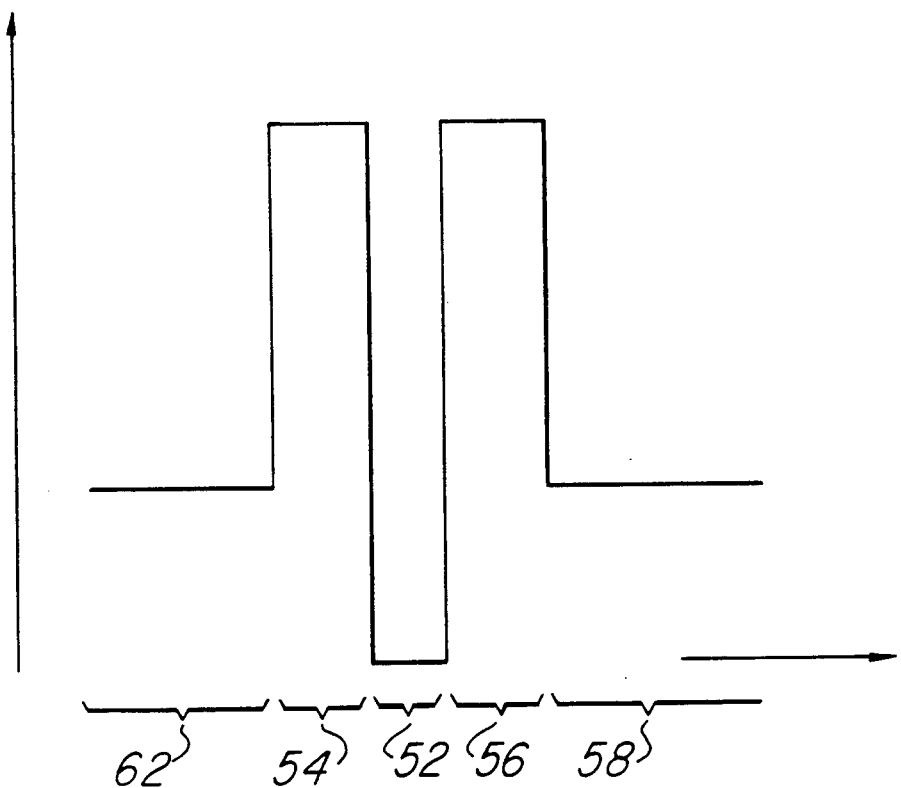
FIGS. 6A–B are composition profiles for the first embodiment.
Figure 6B:
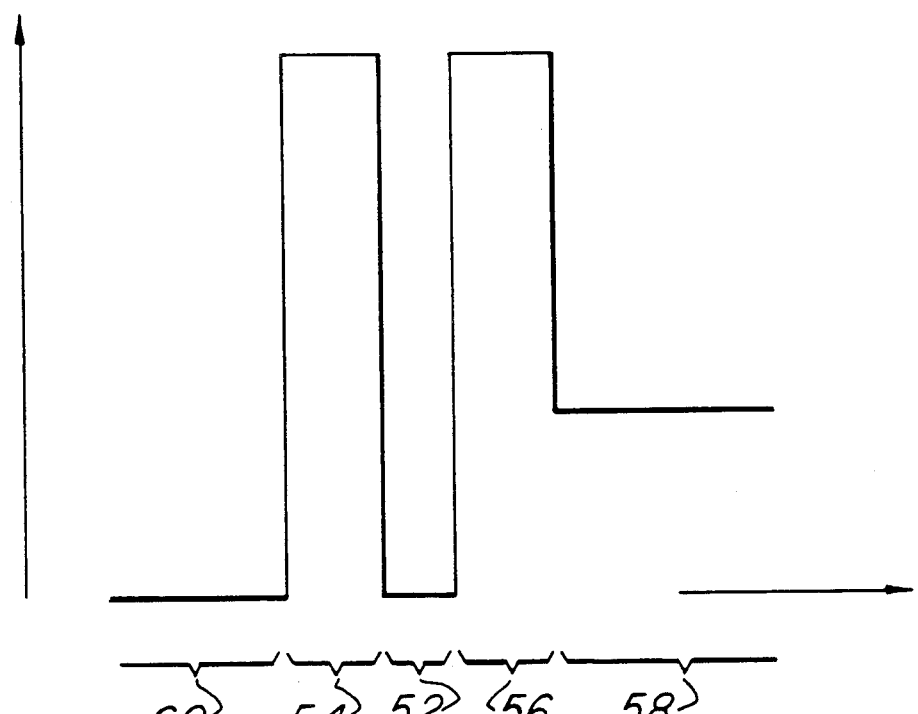
Figure 7A:
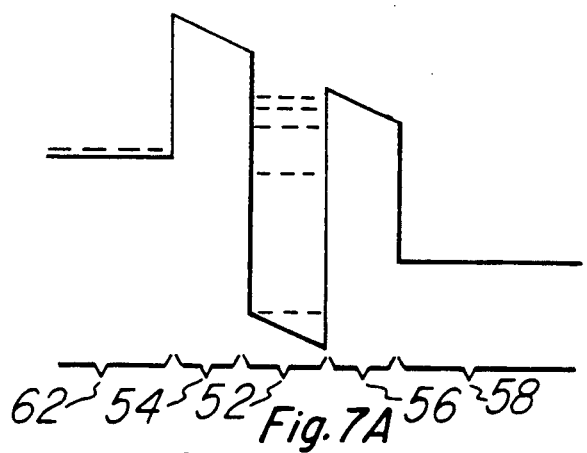
FIGS. 7A–B are conduction band edge diagrams for the first embodiment in the off state.
Figure 7B:
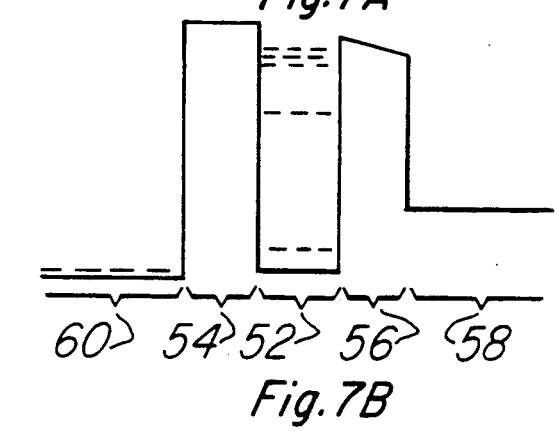

FIGS. 6A-B are composition profiles along lines A-A' and B-B' of FIG. 5A and shows the fraction of AlAs as a function of position. FIGS. 7A-B are energy level diagrams showing the lowest conduction band edge and Fermi level along the same lines A-A' and B-B' of FIG. 5A with no bias applied, and FIGS. 8A-B the same band edges with bias applied. As indicated in FIGS. 7A-B, the conduction band direct gap discontinuity at the interfaces of layers 52 and 54, 52 and 56, and 54 and 60 is about 0.92 eV (920 meV) and the discontinuity at the interfaces of layers 54 and 62 and 56 and 58 is about 0.52 eV (520 meV). Note that these numbers are derived by using the generally accepted partition of the bandgap difference between GaAs and AlGaAs into 60% appearing as a conduction band discontinuity and 40% as a valence band discontinuity. As will be apparent from the following discussion, the partition has no particular effect on the operation of device 50 beyond adjusting the numbers.

The operation of device 50 depends on transition rates of electrons between levels in the conduction band well and tunneling rates, and thus some approximate quantitative analysis will be used as an explanation aid. However, the approximations used and the analysis performed should not be construed to be part of device 50.

Figure 1A:
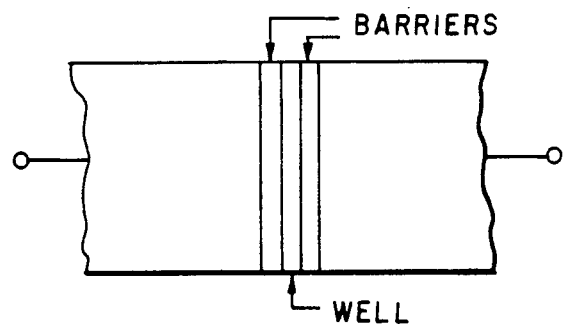
FIGS. 1A–D schematically illustrate a resonant tunneling diode.
Figure 1B:
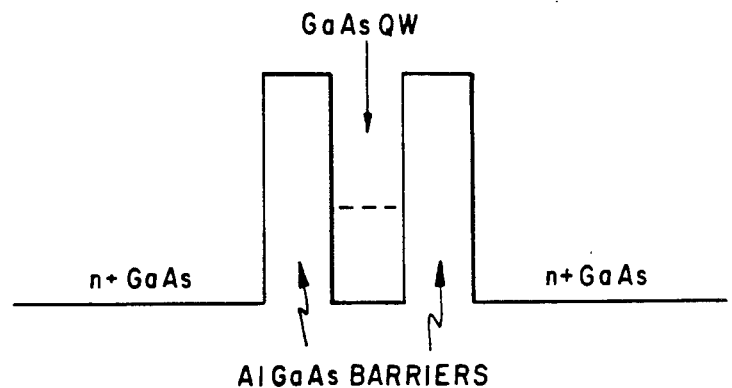
Figure 1C:
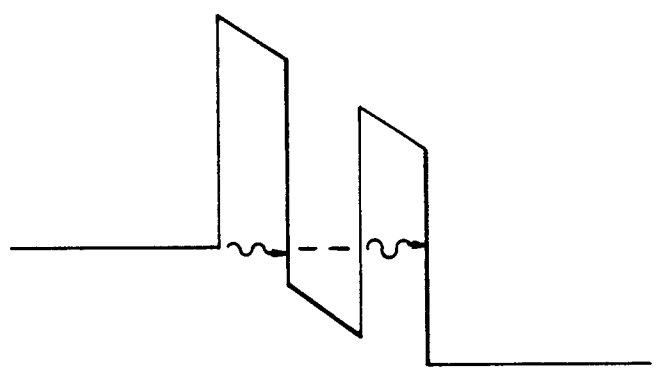
Figure 1D:
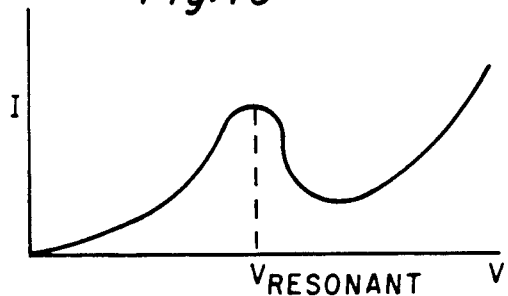
Figure 2A:
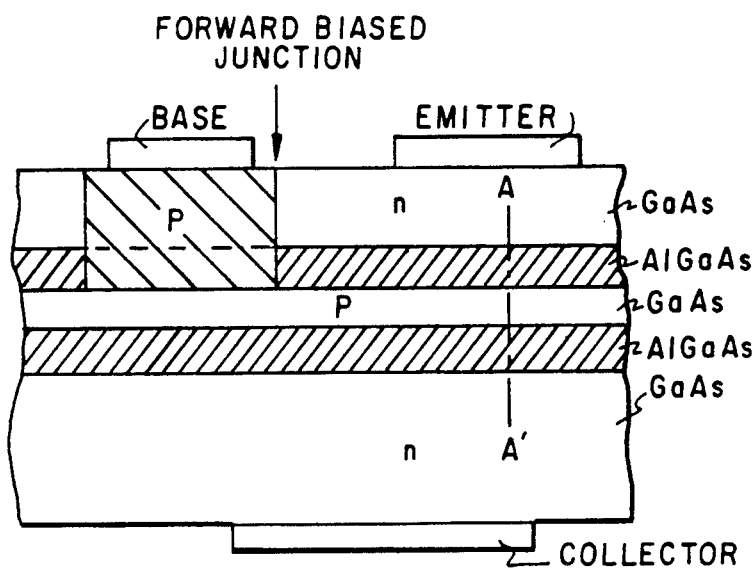
FIGS. 2A–B illustrate a possible opposite carrier type controlled three-terminal resonant tunneling device.
Figure 2B:
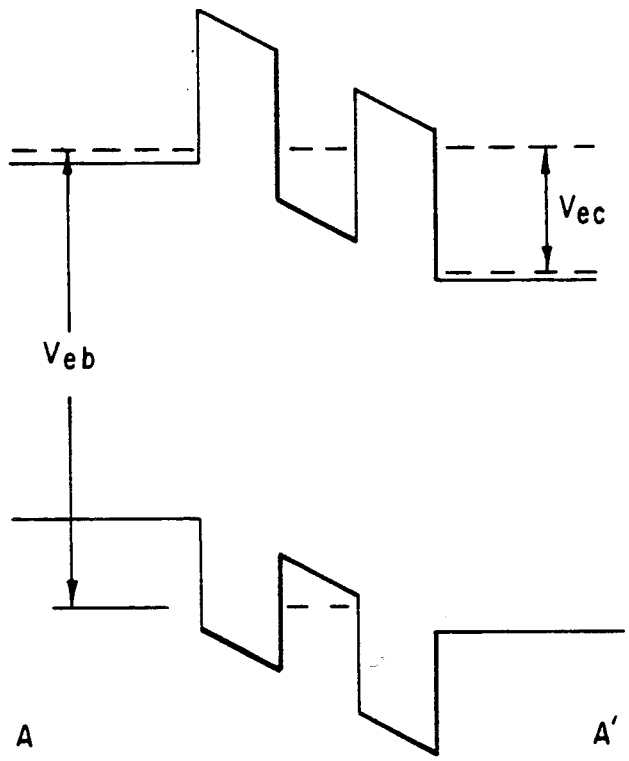
Figure 3A:
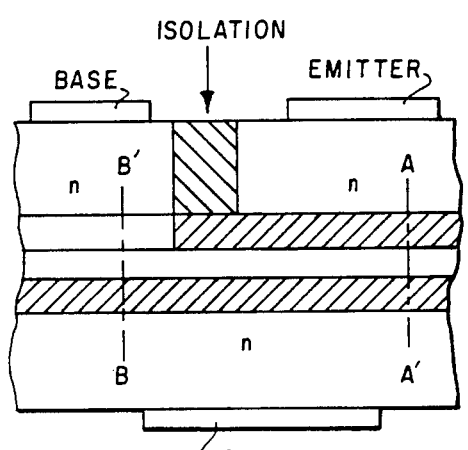
FIGS. 3A–D illustrate a possible same carrier type controlled three-terminal resonant tunneling device.
Figure 3B:
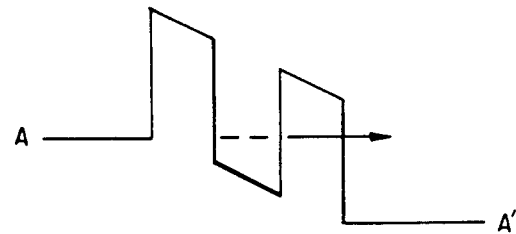
Figure 3C:
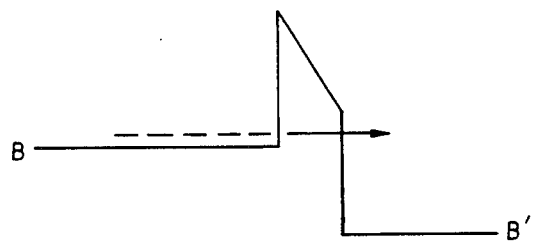
Figure 3D:
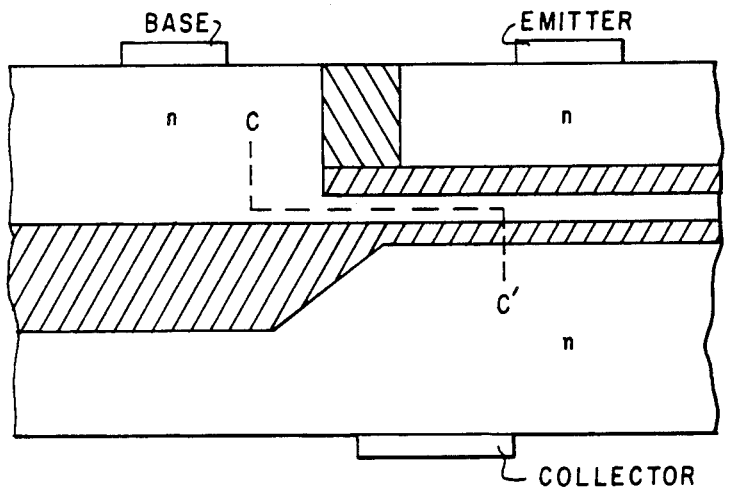
Figure 4A:
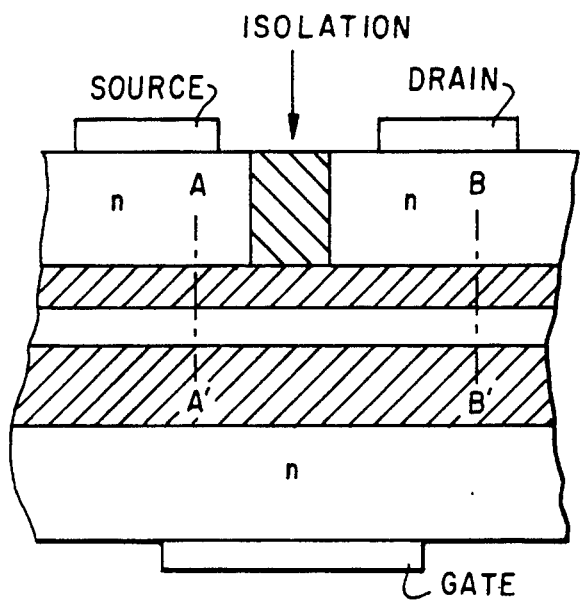
FIGS. 4A–C illustrate a possible field effect three-terminal resonant tunneling device.
Figure 4B:
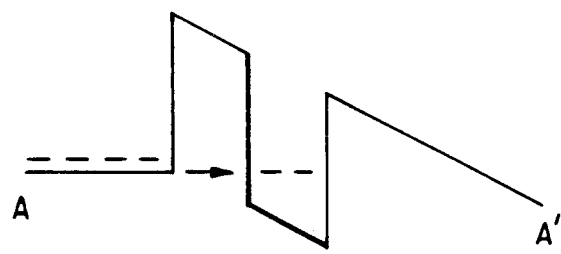
Figure 4C:
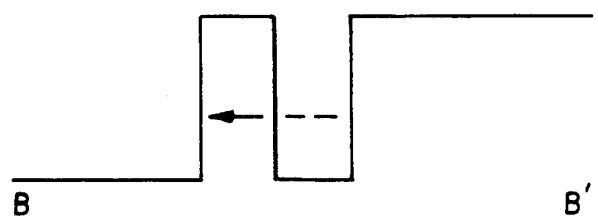

For specificity, a spatial coordinate system is chosen with x the variable along the direction of lines A—A and B—B in FIG. 4A and y, z the variables parallel to the interfaces between the layers 52, 54, 56, and 58. We shall use the effective mass approximation for an electron in the conduction band which presumes the electronic wavefunction is the product of the Bloch function at the bottom of the conduction band and an envelope function of the form:

$$\rho(x)e^{i(yk_y+zk_z+xk_x)}$$

where the wave vectors $k_y$ and $k_z$ are measured relative to the conduction band edge, $k_x$ depends on $k_y$ and $k_z$, and $\rho(x)$ is a solution of the eigenvalue equation:

$$-\frac{\hbar^2}{2m}\rho(x)'' - e\phi(x)\rho(x) = E\rho(x).$$

The electrostatic potential is $\phi(x)$, and E is the eigenvalue corresponding to $\rho(x)$. This models the potential energy of the electron $(-e\phi(x))$ as equal the conduction band edge, with the electrostatic field generated by other electrons in the same or other subbands in well 52 in the conduction band accounted for by band bending. The Bloch function in AlAs will be taken to be of the same form as in GaAs.

The first calculation finds the approximate lowest energy eigenvalues for an electron in the potential well formed by layer 52. Well 52 is a potential well in the x direction only, and thus the discrete energy levels (eigenvalues E) calculated for $k_y$ and $k_z$ equal zero will in fact be the bottoms of subbands with almost a continuum of levels corresponding to increasing $k_y$ and $k_z$ due the large y and z dimensions. The effective mass approximation at the bottom edge of a subband presumes parabolic subband edges (kinetic energy is a quadratic function of wavevector), so the kinetic energy of an electron with wave vector $(k_x, k_y, k_z)$ is $$\frac{(\hbar k_x)^2}{2m_l} + \frac{(\hbar k_y)^2 + (\hbar k_z)^2}{2m_t}$$

where $m_l$ is the effective mass in the x (longitudinal) direction and $m_t$ the effective mass in the y-z (transverse) directions. For calculations, taking both $m_l$ and $m_t$ equal to 0.067 times the rest mass of an electron amounts to using the bulk GaAs lower valley effective mass.

Now, consider the wavefunction of a single electron in the lowest energy subband in well 52; this corresponds to a solution $\rho(x)$ with $-e\phi(x)$ the square well 52 and E the smallest such eigenvalue. We can approximate the wavefunction as follows:

$$\psi_0(x,y,z;k_x,k_y,k_z) = \begin{cases} Au(.)e^{i(yk_y+zk_z)}e^{xk_1} & x \le 0 \\ Bu(.)e^{i(yk_y+zk_z)}\sin(xk_2) + c) & 0 \le x \le 50\text{Å} \\ Cu(.)e^{i(yk_y+zk_z)}e^{-xk_3} & 50\text{Å} \le x \end{cases}$$

where A, B, C, c, $k_1$, $k_2$, $k_3$ are determined by matching boundary conditions, u(.) is the Bloch function, $k_y$ and $k_z$ are the wave vectors in the y and z directions, and $k_1$, $k_2$, $k_3$ are the x wave vectors in the three layers 54, 52, and 56; note that the origin for the x coordinate has been taken to be at the interface of layers 52 and 54 for convenience, and that $k_1$, $k_2$, $k_3$ will be the lowest of a discrete plus continuous set of possible solutions for each $k_y$, $k_z$ pair. Also note that the potentials from layers 54 and 56 have been approximated by constant potentials of infinite extent; and that the electron spin has been suppressed.

The ground state energy (unexcited level, bottom of the lowest subband edge) for well 52 lies at approximately 100 meV above the conduction band edge (that is, the lowest subband bottom edge is 100 meV above the band edge), with the first excited state lying at 400 meV (these low levels were calculated by approximating well 52 with an infinitely high barrier square potential). Above this, the next state lies at approximately 700 meV, with more closely spaced states extending above, due to the proximity (in energy) of the top of the barriers. See FIGS. 7A-B, 8A-B for an indication of the lower energy levels.

Further, observe that if the lowest subband in well 52 were filled with electrons to a density of $1 \times 10^{12}/\text{cm}^2$, then the discrete energy levels are essentially shifted up by about 100 meV due to the electrostatic potential created by the electrons, but the relative spacing of the energy levels has only a negligible change. Such an electron density is feasible in view of the fact that the density of states in a GaAs quantum well is approximately $3 \times 10^{13}/\text{cm}^2\text{eV}$.

The operation of device 50 can now be described. Initially consider a 100 mV bias of emitter 62 relative to collector 58 and a 0 bias of base 60 relative to collector 58. Because emitter 62, base 60, and collector 58 are heavily doped, the potential drop appears across well 52 and barriers 54 and 56, and the conduction band edge along lines A-A' and B-B' of FIG. 5A are as illustrated in FIGS. 7A-B, respectively. Any electrons in well 52 will tunnel out into base 60 or collector 58, so well 52 is essentially empty. No resonant tunneling from emitter 62 into well 52 occurs because the excited levels of well 52 are at least 50 meV different from the Fermi and conduction band edge levels of emitter 62.

Figure 8A:
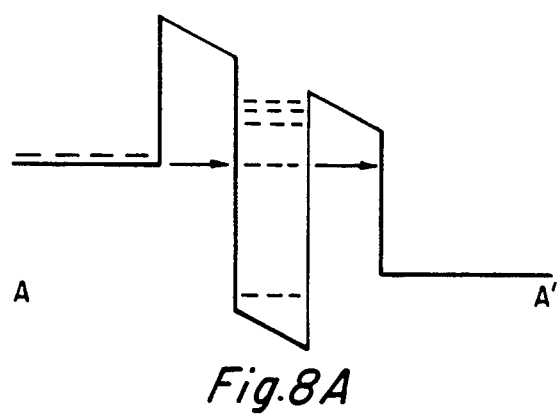
FIGS. 8A–C are conduction band edge diagrams for the first embodiment in the on state plus an eigenfunction illustration.
Figure 8B:
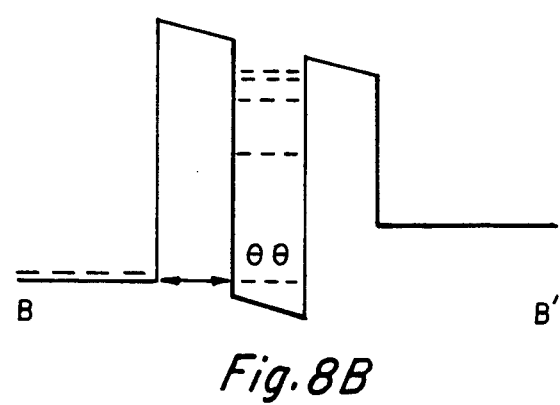
Figure 8C:
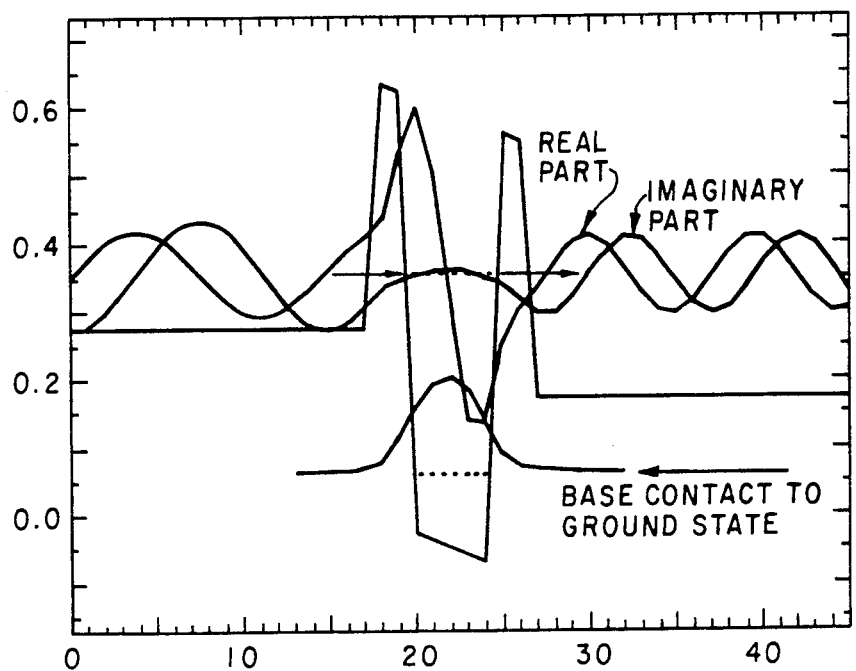
Figure 9:
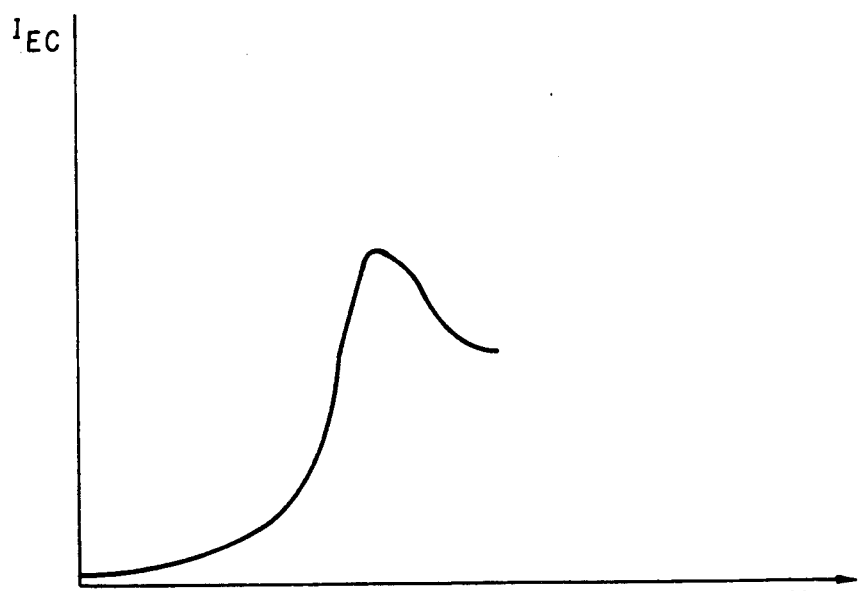
FIG. 9 is a current-voltage diagram for the first embodiment.
Figure 10D:
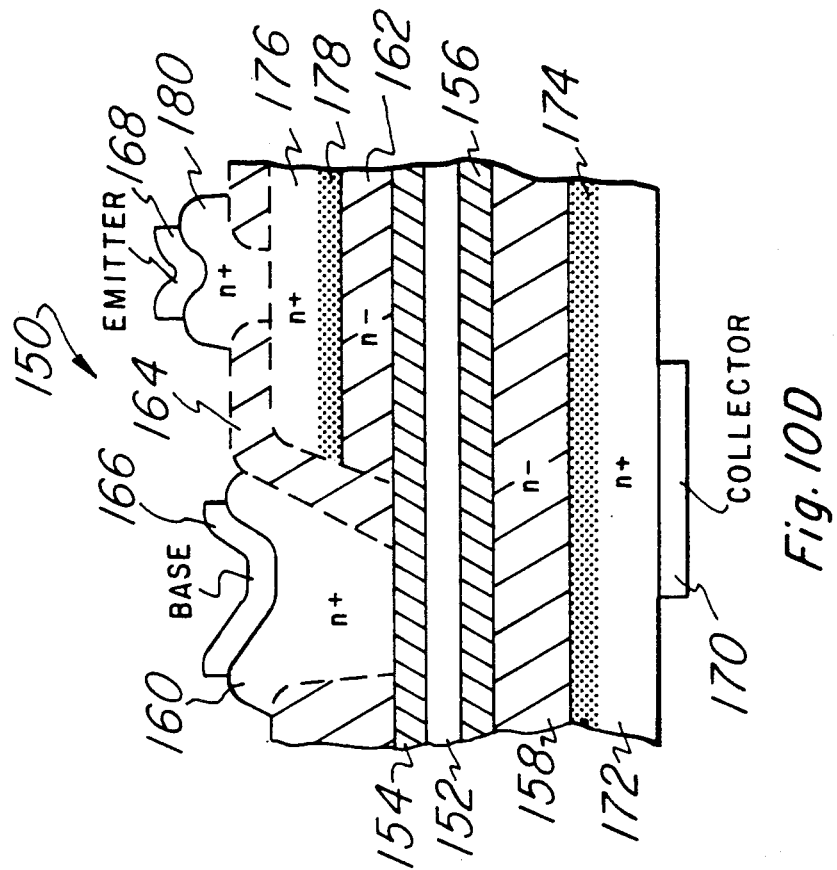
Figure 10C:
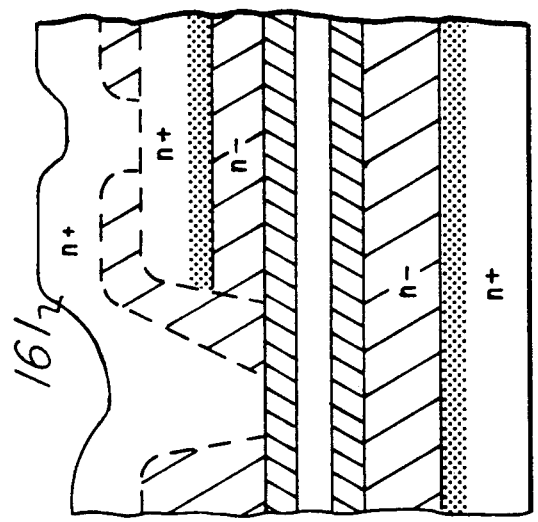

Now consider a bias of base 60 relative to collector 58 of 250 mV with the bias of emitter 62 relative to collector 58 still at 100 mV. The conduction band edge along lines A-A' and B-B' of FIG. 5A are now as illustrated in FIGS. 8A-B, respectively. This base to collector bias injects electrons from base 60 into well 52 and raises the potential of well 52 about 100 mV which is equilibrium between well 52 and base 60. This raising of the potential of well 52 brings the first excited level of well 52 to an energy approximately equal to the Fermi level of emitter 62; and electrons resonantly tunnel from emitter 62 into well 52. Of course, any electrons tunneling into well 52 from emitter 62 will be in the first excited level and will either relax down to the unexcited level (and join the electrons injected from base 60) or tunnel (resonantly) out into either emitter 62 or collector 58. The branching ratio for these choices is roughly the ratio of the relaxation time (in the order of 1 nanosecond) to the tunneling time (less than 100 femtoseconds) and indicates that the relaxation branch is negligible. This means that the "base current" is very small. Further, any electrons relaxing down to the unexcited level will be in equilibrium with base 60 and not affect the potential of well 52. Lastly, the tunneling from well 52 into collector 58 has a higher probability than into emitter 62 because the density of states is higher away from the conduction band edge. Consequently, a current flow from emitter 62 to collector 58 through the first excited level of well 52 has been controlled by the bias of the base 60. As a suggestive illustration of the control electrons and tunneling current electrons, the eigenfunctions for the unexcited and first excited levels are shown in FIG. 8C. Note that the barriers in FIG. 8C were taken to be only about 20 Å thick to suppress the peaking of the first excited level eigenfunction in the well and make a clearer illustration. The current-voltage curve will show the resonant currents, even at room temperature operation; see FIG. 9 for an illustration.

In more detail, the branching ratio may be approximated as follows:

(1) The relaxation of electrons to the ground state via spontaneous emission of a photon is calculated by considering the transition rate between initial and final states in the dipole approximation. Using the states of Coon et al, 45 Appl. Phys. Lett. 649 (1984) yields a relaxation time in the order of a nanosecond, which agrees with experiment (see t'Hooft et al, Int. Conf. Superlattices, Urbana, Ill. 1984), and is so slow that transition (1) may be ignored. Note that the device could lase now if there did not exist a loss mechanism from the excited level because the population is inverted.

(2) The tunneling rate is calculated by integrating the expectation value of the current density over the distribution of incident electrons. See Sollner et al, 43 Appl. Phys. Lett. 588 (1983).

FIGS. 10A-D show in cross sectional view second preferred embodiment tunneling device, generally denoted 150, and the steps of the preferred embodiment method of fabrication of device 150. Device 150 includes layer 152 of undoped GaAs, layers 154 and 156 of undoped $Al_xGa_{1-x}As$ with x=0.8, layer 158 of $Al_xGa_{1-x}As$ with x=0.35 doped n⁻, region 160 of GaAs doped n⁺, region 162 of $Al_xGa_{1-x}As$ with x=0.35 doped n⁻, region 164 (in three parts in this cross sectional view) of $Al_xGa_{1-x}As$ with x=0.35 undoped, gold/germanium contacts 166, 168, and 170, GaAs layer 172 doped n⁺, n doped layer 174 of $Al_xGa_{1-x}As$ with x varying continuously from 0.35 at the interface with layer 158 to 0.0 at the interface with layer 172, n⁺ doped regions 176 and 180 of GaAs, and n doped layer 178 of $Al_xGa_{1-x}As$ with x varying from 0.35 at the interface with region 162 to 0.0 at the interface with region 176. These layers and regions are most conveniently referred to by the names of analogous structures; thus region 160 is called the base, region 162 the emitter, layer 158 the collector, layer 152 the well, and layers 154 and 156 the tunneling barriers. Note that the isolation between the base and the emitter is the undoped $Al_xGa_{1-x}As$ with x=0.35. The thicknesses of barriers 154 and 156 are the same as the corresponding elements of device 50, but well 152 is thicker than well 52 to compensate for the different composition of emitter 162.

Device 150 is fabricated by the following steps of the preferred embodiment method:

(a) Molecular beam epitaxy (MBE) or organometallic chemical vapor deposition (OMCVD) is used to grow a single crystal substrate of $Al_xGa_{1-x}As$ with layers of varying x and varying doping concentrations of silicon as shown in FIG. 10A (with reference numeral corresponding to the element of device 150 formed from the layer) and with the following characteristics:

| Layer | Thickness (Å) | x | Doping concentration |
| --- | --- | --- | --- |
| 172 | ≧5,000 | 0.0 | $10^{19}$ |
| 174 | 500 | 0.0 to 0.35 | $10^{17}$ |
| 158 | 500 | 0.35 | $10^{15}$ |
| 156 | 50 | 0.8 | undoped |
| 152 | 56 | 0.0 | undoped |
| 154 | 50 | 0.8 | undoped |
| 162 | 300 | 0.35 | $10^{15}$ |
| 178 | 500 | 0.35 to 0.0 | $10^{17}$ |
| 176 | 5,000 | 0.0 | $10^{19}$ |

(b) Photoresist is spun on the multilayered $Al_xGa_{1-x}As$ substrate and patterned to define the base 160 plus isolation 164 area together with the perimeter of the active area (this is just defining the complement of emitter 162). The patterned photoresist is then used as a mask to etch layers 176, 178, and 162 with superoxal etchant which stops at barrier 154; note that a slight overetch will thin barrier 154 only in the base area and not affect the thickness at emitter 162. As is apparent from the description of the operation of device 150, a thinner tunneling barrier 154 at base 160 may be beneficial. Then the photoresist is removed and undoped $Al_xGa_{1-x}As$ with x=0.35 layer 164 is grown by MBE or OMCVD over the etched substrate; see FIG. 10B which illustrates the tendency of the growth to be greater in the etched out area.

(c) Photoresist is again spun on and patterned to define base 160 and via 180 through the undoped $Al_xGa_{1-x}As$ 164 to connect to emitter 162; and the patterned photoresist is used as a mask for the etching of layer 164 with aqueous KI which is selective against etching high aluminum alloy. Again, a slight overetch only affects barrier 154 thickness at base 160. The photoresist is removed and n+ doped GaAs layer 161 is grown by MBE or OMCVD; see FIG. 10C.

(d) Photoresist is spun on again and patterned to define in grown layer 161 base 160 and via 180 to emitter 162, and the patterned photoresist is used as a mask for the etching of layer 161 to form base 160 and via 180 to emitter 162. Lastly, gold/germanium contacts 166, 168, and 170 are formed by evaporation and liftoff. See FIG. 10D for the completed device 150.

A third preferred embodiment, not illustrated, is similar to the first and second preferred embodiments but has two bases, both on the same side of the well as the emitter, and is a four-terminal device. This third preferred embodiment uses three of the energy levels in the well: the unexcited level is for the first base, the first excited level is for the second base, and the second excited level is for the conduction current from emitter to collector. Of course, the two bases are of differing materials to align their conduction band edges with the corresponding energy levels of the well. Thus there are at least four different materials in the third preferred embodiment: for example, GaAs in the quantum well and first base, $Al_{0.1}Ga_{0.9}As$ in the second base, $Al_{0.4}Ga_{0.6}As$ in the emitter and collector, and AlAs in the tunneling barriers. The third preferred embodiment may be fabricated by the method for fabrication of the second preferred embodiment with an extra pattern and growth cycle.

Figure 11A:
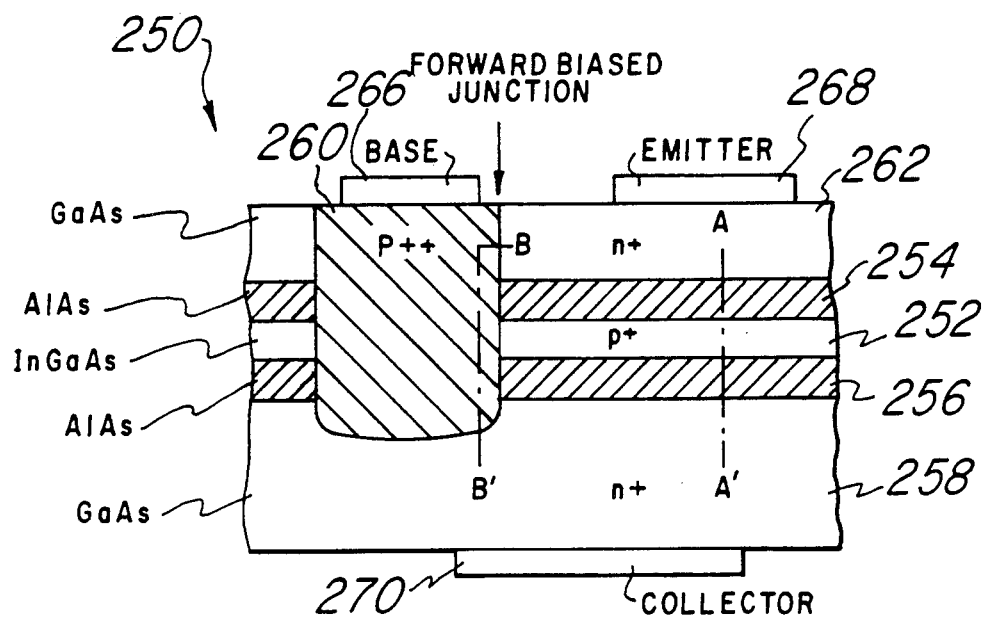
FIGS. 11A–C are schematic cross sectional and plan views of a fourth preferred embodiment.
Figure 11B:
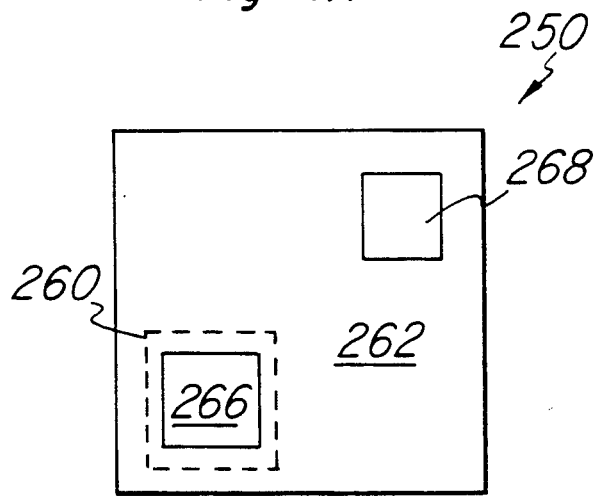
Figure 11C:
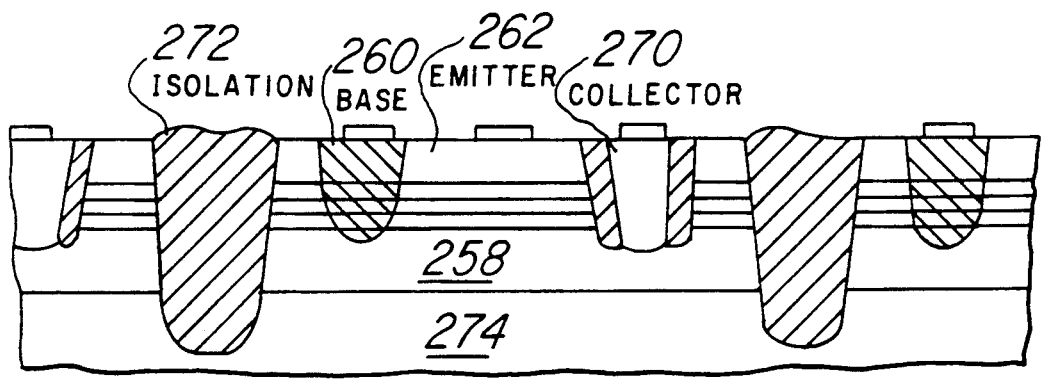

Fourth preferred embodiment three terminal tunneling device, generally denoted 250, is illustrated in schematic cross sectional view in FIG. 11A and top plan view in FIG. 11B, and includes layer 252 of p+ doped $In_{0.9}Ga_{0.1}As$, layers 254 and 256 of undoped AlAs, layers 258 and 262 of n+ doped GaAs, region 260 of p++ doping in layers 252, 254, 256, 258, and 262 (the shaded portion in FIG. 11A), gold/zinc contact 266, and gold/germanium contacts 268 and 270. As previously, the elements of device 250 will be referred to by the name of the analogous structure: 258 is called the collector, 260 the base, 252 the well, 262 the emitter, and 254 and 256 the tunneling barriers. The thicknesses of the layers is as follows: well 252 is about 50 Å, tunneling barriers 254 and 256 are each about 50 Å, layer 262 a few tenths of a micron, and collector 258 may be more than a micron. $In_{0.9}Ga_{0.1}As$ is not lattice matched to GaAs and AlAs, but well 252 is a thin strained layer and preserves lattice match. Note that for mechanical strength collector 258 be quite thick or supported on a further substrate with a via connection instead of the bottom contact 270 shown. FIG. 11B is a top plan view of device 250 which is about ten microns square. Note that device 250 may be large scale integrated by use of via connection 270 to collector 258 and trench isolation 272 of devices; see FIG. 11C for a cross sectional view with devices on a supporting substrate 274 which may be semi-insulating GaAs.

Figure 12A:
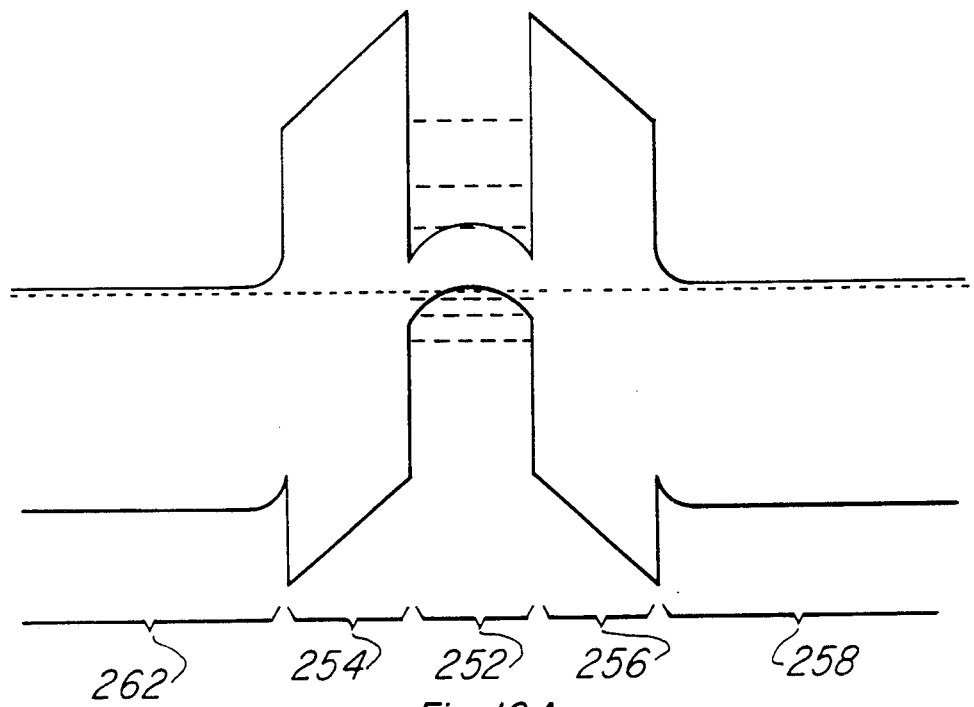
FIGS. 12A–B are conduction and valence band diagrams for the fourth preferred embodiment with no applied bias.
Figure 12B:
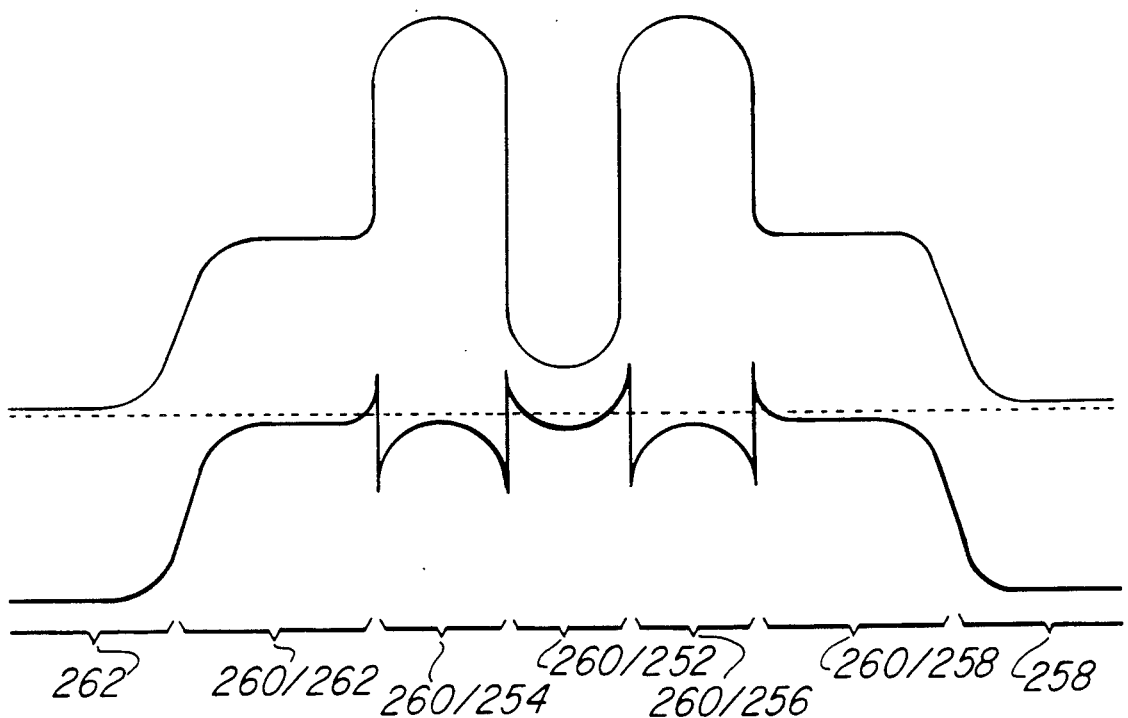

FIG. 12A is a diagram of the conduction and valence band edges along line A-A' of FIG. 11A, and FIG. 12B is the corresponding diagram along line B-B', both diagrams are for no applied bias. Note that line B-B' bends to include emitter 262. FIGS. 13A-B are the corresponding band diagrams for an applied bias. FIGS. 12A-B and 13A-B are analogous to FIGS. 7A-B but with the horizontal scale exaggerated to permit indication of band bending arising from the partial depletion of doped well 252 (recall that well 52 was undoped) and with the vertical scale compressed to permit the valence band to be included. The lowest few subband edges in well 252 (both the conduction band well and the valence band well) are indicated by dashed lines, and the Fermi level is indicated by a (broken) dotted line. The region numbered 260/262 in FIGS. 12B and 13B corresponds to the p++ doped portion of layer 262, the region 260/254 corresponds to the p++ portion of layer 254, and so forth. Note that the p-n junctions in layers 258 and 262 have been included in FIGS. 12B and 13B.

Recalling the calculations in connection with the device 50 and noting the bandgap of $In_{0.9}Ga_{0.1}As$ of about 0.4 eV, the operation of device 250 can be described as follows. A bias of about 2 V is applied from collector 258 to emitter 262, and a bias of about 500 mV from base 260 to emitter 262. The built-in and bias voltages appear across undoped tunneling barriers 254 and 256 as shown in FIGS. 12A and 13A. Also, with these biases the bottom edge of the conduction band in emitter 262 lines up between the lowest and first excited conduction subband bottom edges in well 252, and no resonant tunneling from emitter 262 into well 252 occurs (this is analogous to the off state of device 50 illustrated in FIG. 7A). This is the off state for device 250. The 500 mV bias from base 260 to emitter 262 is a forward bias on the p-n junction as indicated in the left hand portion of FIG. 13B, but the junction is in GaAs which has a bandgap of 1.42 V, so leakage current is small. The use of $In_{0.9}Ga_{0.1}As$ with its small bandgap for the well 252 permits such a bias smaller than the bandgap of the emitter 262 material (GaAs) to align the emitter 262 conduction band edge with the conduction subband edges in well 252. Note that well 252 has holes partially filling the lowest valence subband, and thus is not empty as well 52 was for device 50 in the off state. Also, collector 258 could be made of different bandgap materials (such as AlAs or even $In_{0.9}Ga_{0.1}As$) as is apparent from FIG. 13A.

If the bias on base 260 is now increased or decreased, then the holes in well 252 are either augmented or withdrawn; and the change in hole concentration implies a change in potential in well 252 which means the subbands move relative to the conduction band edge of emitter 262. In either case the appropriate magnitude of bias change will bring the emitter 262 conduction band edge into resonance with a conduction subband bottom edge in well 252, and resonant tunneling of electrons from emitter 262 into a subband of well 252 occurs. As with device 50, an electron resonant tunneling from emitter 262 into well 252 is followed by either resonant tunneling out into collector 258 or back into emitter 262, or by relaxation to a lower subband in well 252 or recombination with a hole in well 252. A graph of the emitter-collector current as a function of the emitter-base voltage will shows peaks analogous to that of device 50 illustrated in FIG. 9; as the emitter-base voltage is increased from zero the hole concentration in the base increases and successive conduction subband edges in well 252 pass through resonance with the conduction band edge of emitter 262. At each resonance a peak in the emitter-collector current appears. The resonant tunneling from emitter 262 into well 252 and out into collector 258 forms the controlled carriers current for device 250, and the holes in well 252 the controlling carriers.

Device 250 is fabricated by the following steps of a preferred embodiment method:

(a) MBE or MOCVD is used to grow the following single cystal layered structure on a substrate of GaAs (or even on GaAs on silicon) with the layer reference numerals the same as the corresponding layers in FIG. 11A:

| Layer | Thickness (Å) | Material | Doping |
| --- | --- | --- | --- |
| 258 | ≧5,000 | GaAs | n $10^{18}$ |
| 256 | 50 | AlAs | undoped |
| 252 | 50 | $In_{0.9}Ga_{0.1}As$ | p $10^{19}$ |
| 254 | 50 | AlAs | undoped |
| 262 | 3,000 | GaAs | n $10^{18}$ |

The n dopant may be silicon, and the p dopant may be beryllium. Note for modulation doping of well 252, acceptors are grown in the AlAs tunneling barriers 254 or 256 or both and well 252 is grown undoped. The holes diffuse from the AlAs and are collected in the valence band well 252.

(b) Photoresist is spun on layer 262 and patterned to define base 260. Then beryllium is implanted using the patterned photoresist as mask, this forms base 260. Alternatively, a $ZnO/SiO_2$ mixture can be deposited and patterned with this followed by rapid thermal annealing (typically 700 degrees C. for a few seconds) to drive the zinc into the layered structure and form base 260. Standard processing can be used to complete device 250.

MODIFICATIONS AND ADVANTAGES

The dimensions and materials of the preferred embodiment tunneling devices can be greatly varied while still preserving the mode of operation. Indeed, the aluminum gallium arsenide system could be replaced with other systems such as indium arsenide phosphide, mercury cadmium telluride, strained layers of lattice mismatched systems, etc. and still maintain single crystal structures; but further, the devices could fabricated from thin layers of glasses, insulators, metals, etc. and still provide the quantum well structure and operation as in the preferred embodiments. Indeed, the insulation between the base and the emitter in the early preferred embodiments could be silicon dioxide with etched vias for base and emitter contact and GaAs overgrown for contact; note that such overgrown GaAs will only be single crystal in the vias and will be polycrystalline elsewhere and therby provide high resistance isolation. The doping of the well in the latter preferred embodiments could be modulation doping by acceptors in the tunneling barriers.

Holes instead of electrons could be the carrier, or even both holes and electrons transported in opposite directions simultaneously. The energy levels could be changed by either dimensional changes or material changes or combinations. For example, the wells could have triangular composition profiles and more strained layers could be used. Indeed, any composition profile yielding a band edge which has both high and low level regions for separate tunneling may operate in a manner analogous to the earlier preferred embodiments. In fact, the symmetry of the preferred embodiments is not necessary; the tunneling barriers could be of differing thicknesses and materials and the tunneling barrier for the base could differ from the tunneling barriers for the emitter and collector, and the emitter and collector of differing materials. Observe that the collector material could have a conduction band edge much lower than that of the emitter as long as it is above the base conduction band edge to preclude tunneling of the control electrons out into the collector in the undoped well versions. Similarly, the base and well materials could be of differing materials to adjust the turn-on voltage.

The temperature of operation may be adjusted, and this has the effect of expanding or contracting the phonon population and thus the speed of transitions between closely spaced levels.

Various geometries are available, such as interdigitated base and emitter, multiple emitters, multiple collectors, multiple bases, use of multiple energy levels of the well, and so forth.

The ratio of the speed of the relaxation down from the excited levels to the ground levels in the wells to the speed of tunneling out of the wells could be adjusted so that by use of various different emulating superlattices by changing the superlattice period (even a varying "period") and component materials. Also, strained layer superlattices, modulation doped superlattices and tunable superlattices could be used and provide further controllable parameters in the operation; for example, a tunable modulation-doped superlattice with graded doping to produce an approximate saw tooth conduction and/or valence band edge.

The use of the unexcited level for the control electrons and the excited level for the conduction current electrons could be reversed: the conduction current would tunnel through the unexcited level and the control electrons would be injected into an excited level. In this case the base current would be the injected electrons that relax down to the unexcited level and join the conduction current; however, the emitter and collector would need conduction band gaps about the excited level to preclude the control electrons from tunneling out.

The bias of the emitter band edge between two subband levels to permit base bias changes in either direction to establish resonance could be changed to bias the emitter band edge below the lowest subband level so only bias increase establishes resonance.

The device can be operated in either the enhancement mode (as are the preferred embodiments) or in the depletion mode (with no bias on the base resonant tunneling from the emitter into the well occurs, and with base bias applied the resonance is disrupted) by adjusting the dimensions and materials.

The advantages of the preferred embodiments and modifications include the extremely small devices with high transfer speeds and high density available with relatively simple structure and fabrication.

What is claimed is:

1. A method of fabrication of tunneling devices, comprising the steps of:
    (a) growing a single-crystal layered semiconductor body with the following layers from bottom to top:
        i. thick, heavily doped, and narrow bandgap material,
        ii. thick, heavily doped, and graded bandgap from narrow to medium bandgap material,
        iii. thick, lightly doped, and medium bandgap material,
        iv. thin (tunneling barrier), undoped, and wide bandgap material, v. thin (quantum well), undoped, and narrow bandgap material, vi. thin (tunneling barrier), undoped, and wide bandgap material, vii. thick, lightly doped, and medium bandgap material, viii. thick, heavily doped, and graded bandgap from medium to narrow bandgap material, and ix. thick, heavily doped, and narrow bandgap material;

(b) spinning photoresist on the top of said body and patterning said photoresist to define a base plus isolation region;

(c) selectively etching layers vii, viii and ix of said semiconductor body with said patterned photoresist as mask, stopping at the wide bandgap layer vi;

(d) removing said photoresist and growing thick, undoped medium bandgap semiconductor material over the etched surface;

(e) spinning on second photoresist and patterning said second photoresist to define a base region and an emitter region;

(f) selectively etching the undoped, medium bandgap semiconductor material with said second patterned photoresist as mask, stopping at the wide bandgap layer vi at a first region thereof and stopping at the narrow bandgap layer ix at a second region thereof;

(g) removing said second photoresist and growing thick, heavily doped narrow bandgap semiconductor material over the etched surface;

(h) spinning on third photoresist and patterning said third photoresist to define an isolation between the base and emitter;

(i) etching the narrow bandgap semiconductor material with said patterned second photoresist as a mask, stopping at the grown medium bandgap semiconductor material; and (j) forming ohmic contacts on the heavily doped, narrow bandgap exposed semiconductor material.

2. The method of claim 1 where said single crystal material is $Al_xGa_{1-x}As$ and said layer in (a) i is at least about 5000 Angstroms thick with $x=0$, said layer in (a) ii is about 500 Angstroms thick and $x=$from 0 to about 0.35, said layer in (a) iii is about 500 Angstroms thick and $x=$about 0.35, said layer in (a) iv is about 50 Angstroms thick and $x=$about 0.8, said layer in (a) v is about 56 Angstroms thick and x is 0, said layer in (a) vi is about 50 Angstroms thick and $x=$about 0.8, said layer in (a) vii is about 300 Angstroms thick and $x=$about 0.35, said layer in (a) viii is about 500 Angstroms thick and $x=$from about 0.35 to 0 and said layer in (a) ix is about 5000 Angstroms thick and $x=0$.

3. The method of claim 2 wherein said layer in (a) i is doped to a doping concentration of about $10^{19}$, said layer in (a) ii is doped to a doping concentration of about $10^{17}$, said layer in (a) iii is doped to a doping concentration of about $10^{15}$, said layers in (a) iv to vi are undoped, said layer in (a) vii is doped to a doping concentration of about $10^{15}$, said layer in (a) viii is doped to a doping concentration of about $10^{17}$ and said layer in (a) ix is doped to a doping concentration of about $10^{19}$.

4. A method of fabrication of tunneling devices, comprising the steps of:

(a) forming a single crystal substrate of $Al_xGa_{1-x}As$ having a plurality of layers included a pair of interior spaced barrier layers, a well layer therebetween and a pair of opposed exterior layers, each layer having a different value of x relative to the layers in contact therewith;

(b) removing a portion of each of said layers disposed over one of said barrier layers to expose a portion of said one barrier layer;

(c) forming a further layer of undoped $Al_xGa_{1-x}As$ where $x=$about 0.35 replacing said removed portion, said layer extending over one of said opposed exterior layers of said single crystal;

(d) forming a first via in said further layer extending to said one barrier layer and a second via extending to said one of said opposed exterior layers of said substrate;

(e) forming n+ doped GaAs in said vias extending to the exposed layers at the bottoms of said vias to form base and emitter regions; and (f) forming base and emitter contacts to said base and emitter regions and a collector contact on the opposite exterior layer of said substrate.

5. The method of claim 4 wherein said single crystal includes first, said one layer which is heavily doped and of narrow bandgap material, second, a layer immediately thereunder which is heavily doped and has a graded bandgap from narrow to medium, third, a layer immediately thereunder which is lightly doped and medium bandgap, fourth, said first barrier layer immediately thereunder which is undoped and wide bandgap, fifth, said quantum well immediately thereunder which is undoped and narrow bandgap, sixth, said second barrier layer immediately thereunder which is undoped and wide bandgap, seventh, a lightly doped medium bandgap layer immediately thereunder, eighth, a heavily doped and graded bandgap layer immediately thereunder and ninth, a heavily doped and narrow bandgap material being the opposite exterior layer of said substrate.

6. The method of claim 5 wherein said first layer is at least about 5000 Angstroms thick with $x=0$, said second layer is about 500 Angstroms thick and $x=$from 0 to about 0.35, said third layer is about 500 Angstroms thick and $x=$about 0.35, said fourth layer is about 50 Angstroms thick and $x=$about 0.8, said fifth layer is about 56 Angstroms thick and x is 0, said sixth layer is about 50 Angstroms thick and $x=$about 0.8, said seventh layer is about 300 Angstroms thick and $x=$about 0.35, said eighth layer is about 500 Angstroms thick and $x=$from about 0.35 to 0 and said ninth layer is about 5000 Angstroms thick and $x=0$.

7. The method of claim 6 wherein said first layer is doped to a doping concentration of about $10^{19}$, said second layer is doped to a doping concentration of about $10^{17}$, said third layer is doped to a doping concentration of about $10^{15}$, said fourth to sixth layers are undoped, said seventh layer is doped to a doping concentration of about $10^{15}$, said eighth layer is doped to a doping concentration of about $10^{17}$ and said ninth layer is doped to a doping concentration of about $10^{19}$.

* * * * *